United States Patent
Butler et al.

(10) Patent No.: US 6,420,934 B1
(45) Date of Patent: Jul. 16, 2002

(54) AUTOMATIC GAIN CONTROL CIRCUIT FOR SIGNAL WITH DIVERSE POWER LEVEL RANGE

(75) Inventors: Iain C. Butler, Santa Cruz; Stephen Allott, Scotts Valley, both of CA (US)

(73) Assignee: TelenComm, Inc., Santa Clara, CA (US)

(*) Notice: Subject to any disclaimer, the term of this patent is extended or adjusted under 35 U.S.C. 154(b) by 0 days.

(21) Appl. No.: 09/645,475

(22) Filed: Aug. 24, 2000

(51) Int. Cl.$^7$ ................................................. H03G 3/10
(52) U.S. Cl. ..................... 330/279; 330/129; 455/234.1; 455/245.1
(58) Field of Search ................................. 330/129, 279; 455/234.1, 245.1

(56) References Cited

U.S. PATENT DOCUMENTS 5,841,320 A * 11/1998 Ichihara ...................... 330/133
6,172,559 B1 * 1/2001 Yamaguchi .................. 330/51
6,205,189 B1 * 3/2001 Ha .......................... 455/232.1

* cited by examiner

*Primary Examiner*—Michael B Shingleton
(74) *Attorney, Agent, or Firm*—Townsend and Townsend and Crew LLP; Henry K. Woodward

(57) ABSTRACT

An automatic gain control circuit for amplifying an input signal of varying strength and having a fast attack mode of operation and a tracking mode of operation includes a gain controlled amplifier for receiving the input signal and producing an amplified analog output signal, a receive signal strength indicator (RSSI) circuit for receiving the amplified analog signal and producing an output voltage indicative of strength of the signal, and decision logic circuitry responsive to the output voltage from the RSSI circuit for controlling gain to the gain controlled amplifier. A plurality of comparators is provided for comparing the output voltage from the RSSI circuit to threshold voltages in generating output signals indicative of the voltage comparisons which can indicate the RSSI output voltage being very low, low, high, or very high as inputs to the decision logic circuit. The decision logic circuitry can then provide a fast acquisition mode of operation or a tracking mode of operation depending on the output signals from the plurality of comparators. In preferred embodiments, the gain controlled amplifier can comprise a plurality of cascaded gain controlled amplifier circuits with the gains of the cascaded gain control amplifier circuits being controlled by the decision logic circuitry. The threshold voltages provided to the plurality of comparators can be programmable for specific modes of operation.

14 Claims, 9 Drawing Sheets

AUTOMATIC GAIN CONTROL CIRCUIT FOR SIGNAL WITH DIVERSE POWER LEVEL RANGE

BACKGROUND OF THE INVENTION

This invention relates generally to automatic gain control circuitry, and more particularly the invention is directed to automatic gain control for signals with diverse power level ranges such as signals sent by wireless transmission.

Broadcast signals such as cellular telephone signals are received by antenna means and converted to digital form by an analog digital converter (ADC) for demodulation and processing. Due to the varying power level of wireless transmitted signals, an automatic gain control circuit (AGC) is normally included before the ADC for proper conversion of the analog signals. For example, the low power Bluetooth standard for wireless transmitted signals provides a 4 pulse preamble for AGC and DC offset calibration before transmitted data. This necessitates an AGC circuit which has fast response in signal acquisition and gain control.

Heretofore, feedback control to the AGC has been implemented in two architectures, one purely analog and another mixed-signal i.e., analog and digital. The analog feedback control architecture uses an analog RSSI to determine signal voltage/power and feeds back an analog control voltage. This requires the AGC control to be analog, which means that no digital intelligence can be implemented within the loop. The result is normally a slow response to large signal power discontinuities or AGC loop ringing due to loop overshoot.

The mixed-signal prior art architecture feedback to the AGC has been taken after the ADC circuit which necessitates a digital to analog conversion for the feedback control signal. Further, a Receive Signal Strength Indicator (RSSI) circuit has been provided in the CPU and logic block which receives the digital signals from the ADC circuit. The RSSI circuit can provide an indication of voltage or power range of the signal and provide feedback to the AGC circuitry. However, this circuitry does not have the response time needed for optimum usage with signals such as Bluetooth.

The present invention is directed to AGC circuitry with enhanced speed of operation in signal acquisition mode.

SUMMARY OF THE INVENTION

In accordance with the invention, an analog RSSI circuit is provided in a feedback loop prior to the ADC circuitry to enhance acquisition speed. The loop combines programmable decision logic to establish a desired voltage level or sweet spot, and a plurality of voltage ranges for fast acquisition and for tracking.

In a preferred embodiment, the AGC architecture includes cascaded variable gain amplifiers (VGA) each with a dynamic gain range equal to the summation of the cascaded VGA gains. The VGA's are controlled by a digital control circuit, which determines the signal level at the output of the AGC and corrects it to keep the AGC output within the ADC nominal input range.

An analog Receive Signal Strength Indicator (RSSI) and a set of comparators determine the AGC output signal level with respect to predetermined DC threshold settings. This level determination differs from conventional AGC architectures, where the AGC output signal level determination is normally determined in the baseband device. The loop latency of the normal architecture (due to signal power averaging functions) is such that it limits the AGC response time. This in-turn means this architecture cannot react readily to bursty data in the receive channel.

The AGC architecture in accordance with a preferred embodiment of the invention uses comparators to determine when the RSSI signal level is very low, low, high or very high. This in-turn signifies if the AGC output level is very low, low, high or very high. The digital control circuit then increases the VGA gains relative to the measured signal level with very high, high, low, very low gain jumps, so as to bring the AGC output level within the ADC nominal range (sweet spot) within one decision cycle. This is termed a fast attack AGC response. After the fast attack response, the AGC tracks any signal level variations at the input using a tracking mode, where the AGC steps in signal discrete gain increments/decrements. If the AGC input signal should then exceed the very low or very high levels, the fast attack response is entered again.

The boundaries of the very low, low, high and very high ranges are determined by the comparators, and more specifically by the DC reference voltages on the comparator inputs. By altering these DC voltages the range boundaries can be moved relative to each other. The voltage levels are generated using simple Digital-to-Analog Converter (DAC) methods, which allows the DC comparator reference voltages to be digitally controlled. This operation allows the range boundaries to be optimized for the quickest AGC response time and also to allow for compensation for any receive path gain variations from nominal. The digital control circuit gain jumps are also programmable to optimize AGC response time and allow for receive path variation.

The invention and objects and feature thereof will be more readily apparent from the following detailed description and dependent claims when taken with the drawing.

DETAILED DESCRIPTION OF ILLUSTRATIVE EMBODIMENTS

Figure 1:
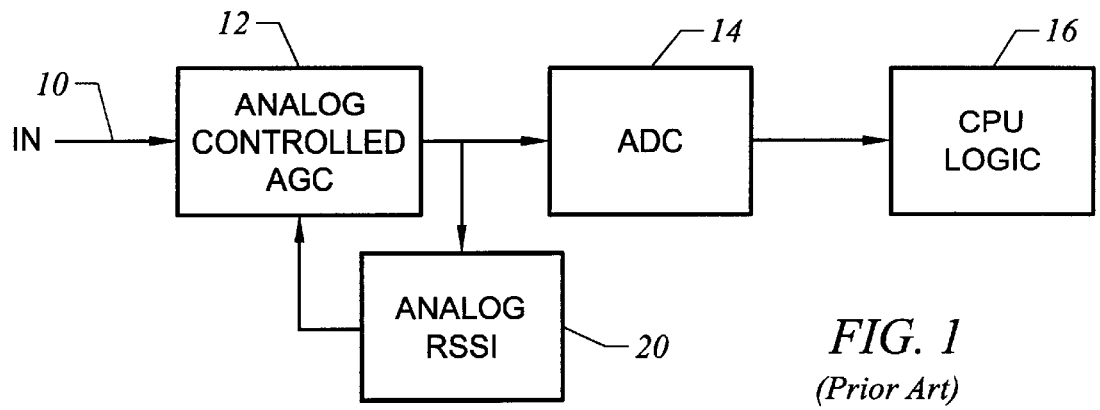
FIG. 1 is a functional block diagram of automatic gain control circuitry in accordance with prior art using an analog AGC loop.
Figure 2:
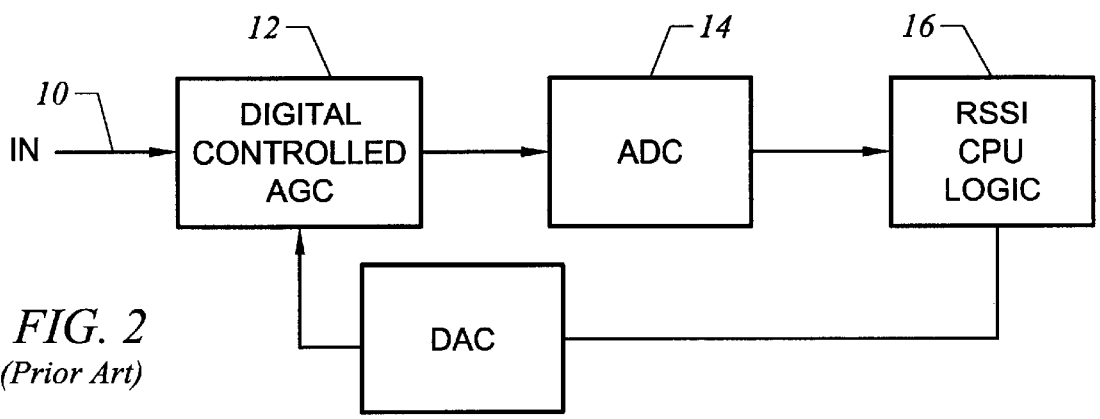
FIG. 2 is a functional block diagram of automatic gain control circuitry in accordance with prior art using a mixed-signal loop.

FIGS. 1 and 2 are block diagrams of AGC architectures in accordance with prior art in which an input signal at 10 is received by AGC circuitry 12 which selectively amplifies the input signal and provides an output to ADC circuit 14. The digital output from ADC 14 is then passed to CPU and logic circuitry at 16 which also includes an RSSI function for determining amplitude of the AGC signal. A feedback loop at the output of ADC 14 is provided through a DAC circuit 18 with the analog output signal from DAC 18 applied to AGC 12 as a gain control signal.

The analog circuitry of FIG. 1 is limited in intelligence, while the circuitry of FIG. 2 has several limitations in speed of operation including the placement of the RSSI circuit in the CPU and logic module 16, and also the need for a DAC circuit 18 in providing a gain control feedback to AGC circuit 12.

Figure 3:
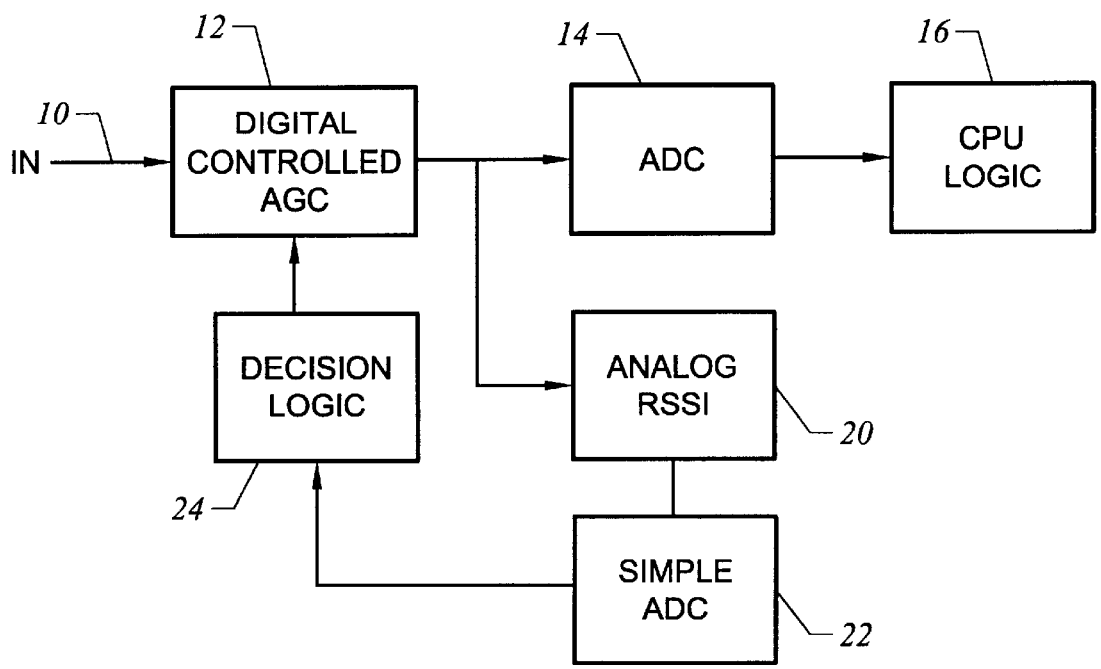
FIG. 3 is a functional block diagram of automatic gain control circuitry in accordance with the present invention.

FIG. 3 is a functional block diagram of AGC architecture in accordance with the present invention which overcomes limitations of the prior art illustrated in FIGS. 1 and 2. Again, the input signal at 10 is applied to AGC circuit 12 with the amplified output from AGC 12 applied to ADC circuit 14, and then to CPU/logic module 16. In accordance with the invention, the control loop for AGC circuit 12 is taken at the output of AGC 12 and includes an analog RSSI circuit 20 similar to the function in module 20 of FIG. 1 and module 16 of FIG. 2, and provides an indication of received signal strength at the output of AGC 12. The output of RSSI block 20 is then applied to an ADC circuit 22 with the digital output from unit 22 applied to decision logic 24 for controlling the gain of AGC unit 12.

Figure 4:
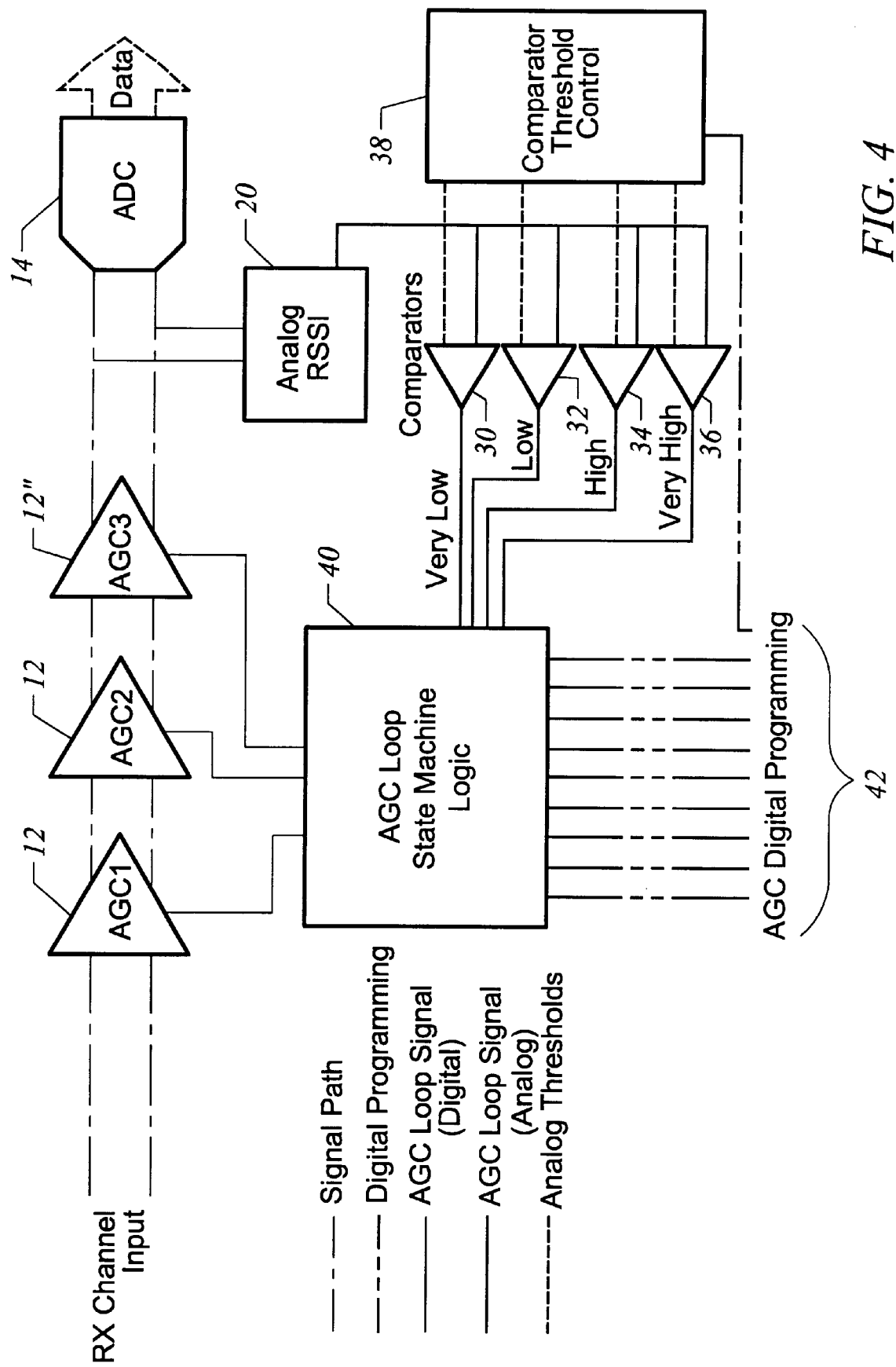
FIG. 4 is a functional block diagram of automatic gain control circuitry in accordance with one embodiment of the invention.
Figure 5:
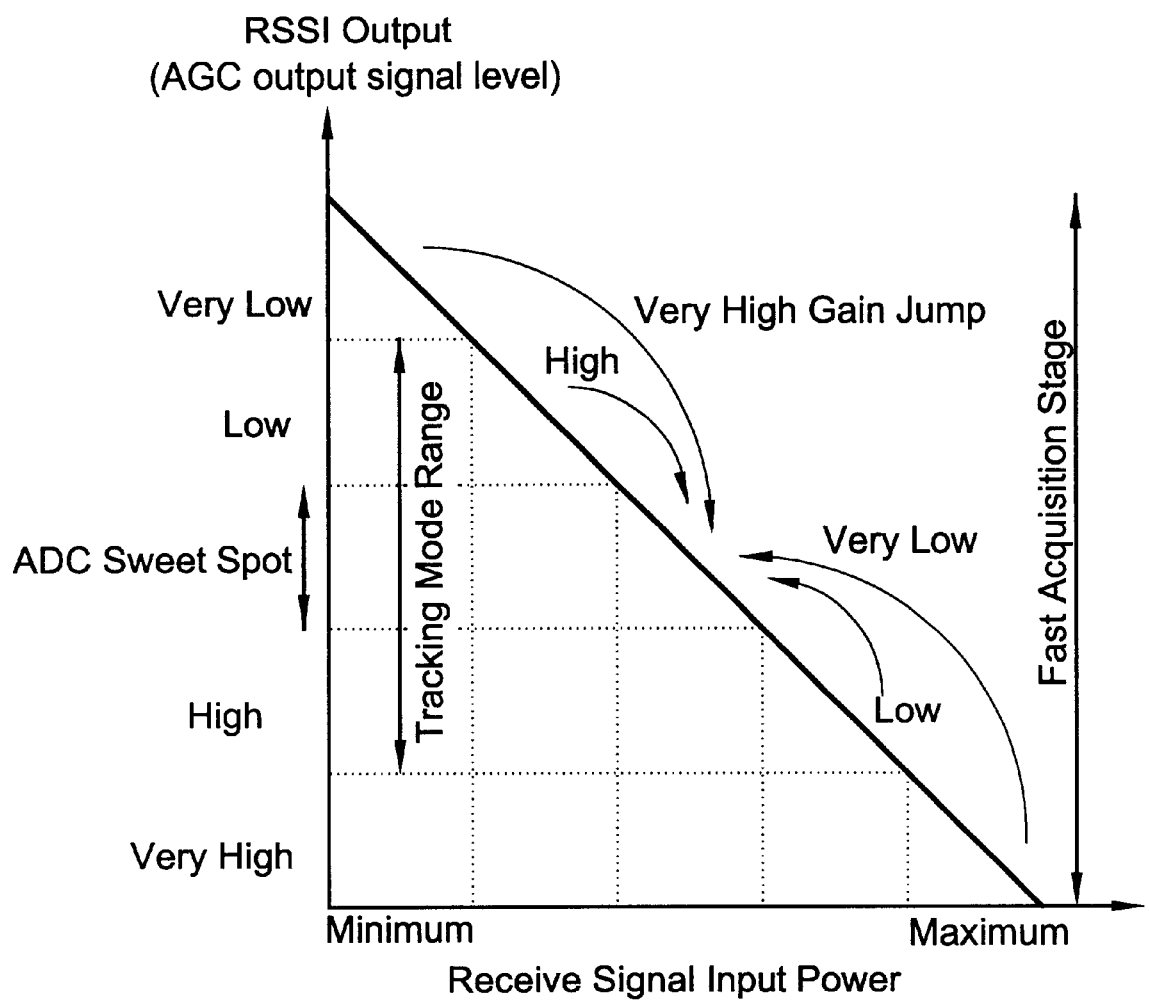
FIG. 5 is a plot of RSSI output versus received signal input in accordance with one embodiment of the invention.

Referring to FIG. 4, in accordance with a preferred embodiment of the invention, a plurality of cascaded AGC units 12, 12', 12", are provided between the input and the ADC unit 14, and RSSI unit 20 functions with comparators 30, 32, 34, 36 to determine the AGC output signal level with respect to predetermined DC threshold settings from unit 38. The comparators are used to determine when the RSSI signal level is very low, low, high, or very high as compared to the threshold voltages from unit 38. The logic outputs from comparators 30–36 are applied to AGC loop logic 40 which then increases the VGA gains relative to the measured signal with very high, high, low, very low gain jumps so as to bring the AGC output level within the ADC nominal range (sweet spot) within one decision cycle. This is the fast response or fast acquisition stage of the AGC response, as illustrated in the plot of FIG. 5. The loop logic 40 can quickly adjust the gain of the AGC units to achieve the ADC sweet spot as shown in FIG. 5. After the fast attack response, the AGC tracks any signal level variation at the input using a tracking mode where the AGC steps in single discrete gain increments/decrements to maintain the sweet spot. Should the AGC input signal then exceed the very low or very high levels, the fast attack response is again entered.

The boundaries of Very Low, Low, High and Very High ranges are determined by the comparators, and more specifically by the DC reference voltages on the comparator inputs provided by threshold control unit 38. By altering these DC voltages, the range boundaries can moved relative to each other. The voltage levels are generated using simple digital to analog converter (DAC) methods, which allows DC comparator reference voltages to be digitally controlled. This operation also allows the range boundaries to be optimized for the quickest AGC response time and also allow for compensation for any receive path gain variations from nominal. The digital control circuit gain jumps are also programmable from the CPU unit, as shown in 42, to optimize AGC response time and allow for receive path variation. Thus, the AGC fast acquisition response can be optimized by the use of programmability of the signal power threshold settings and the gain jump definitions. This programming can be accomplished by a software or via other digital state machine access. Provision of the analog RSSI unit 20 within the digital control loop increases dynamic range and speed of operation of the AGC circuit.

Figure 6:
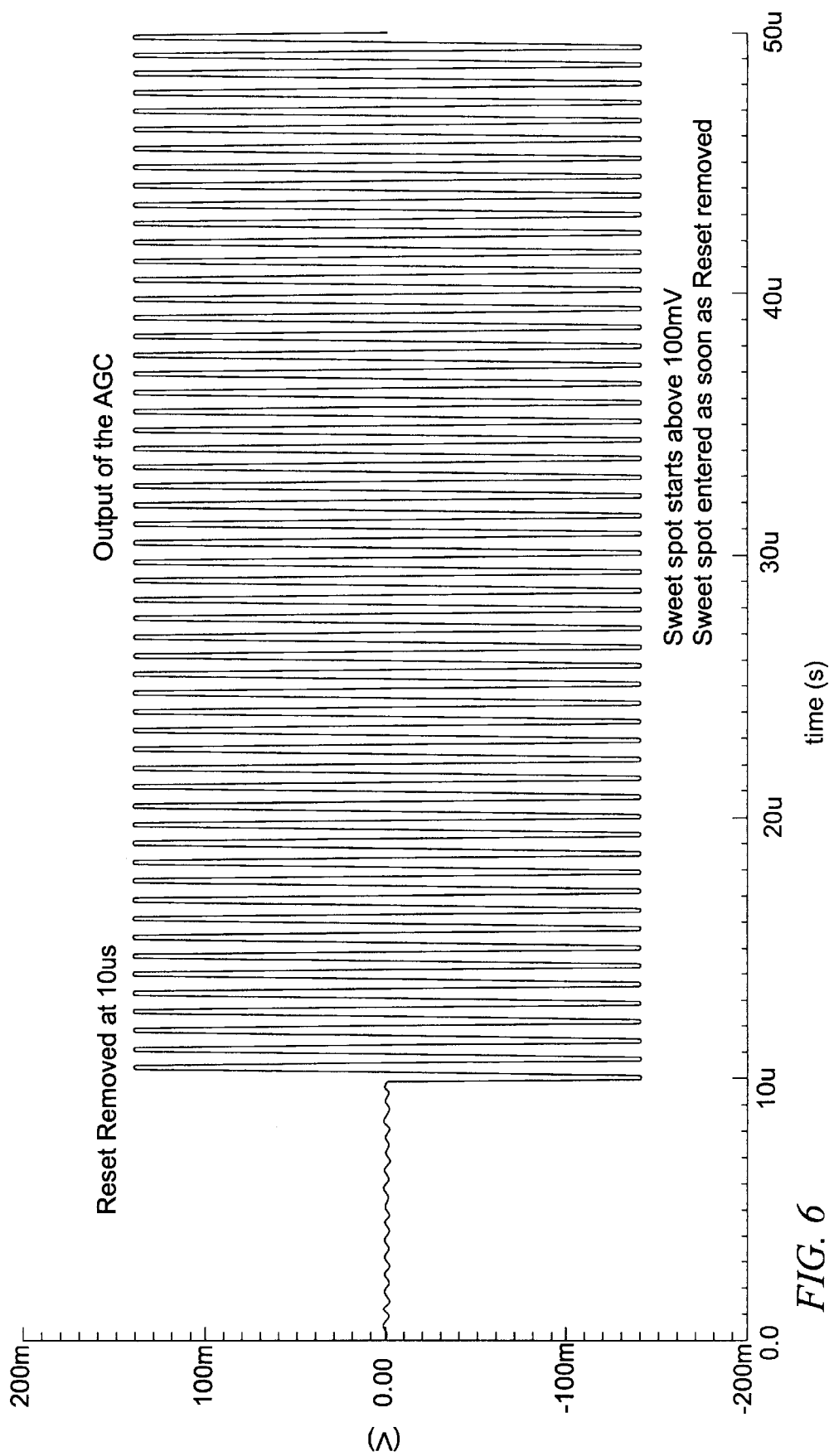
FIG. 6 is a plot of AGC output response to a low level input signal (fast response mode).
Figure 7:
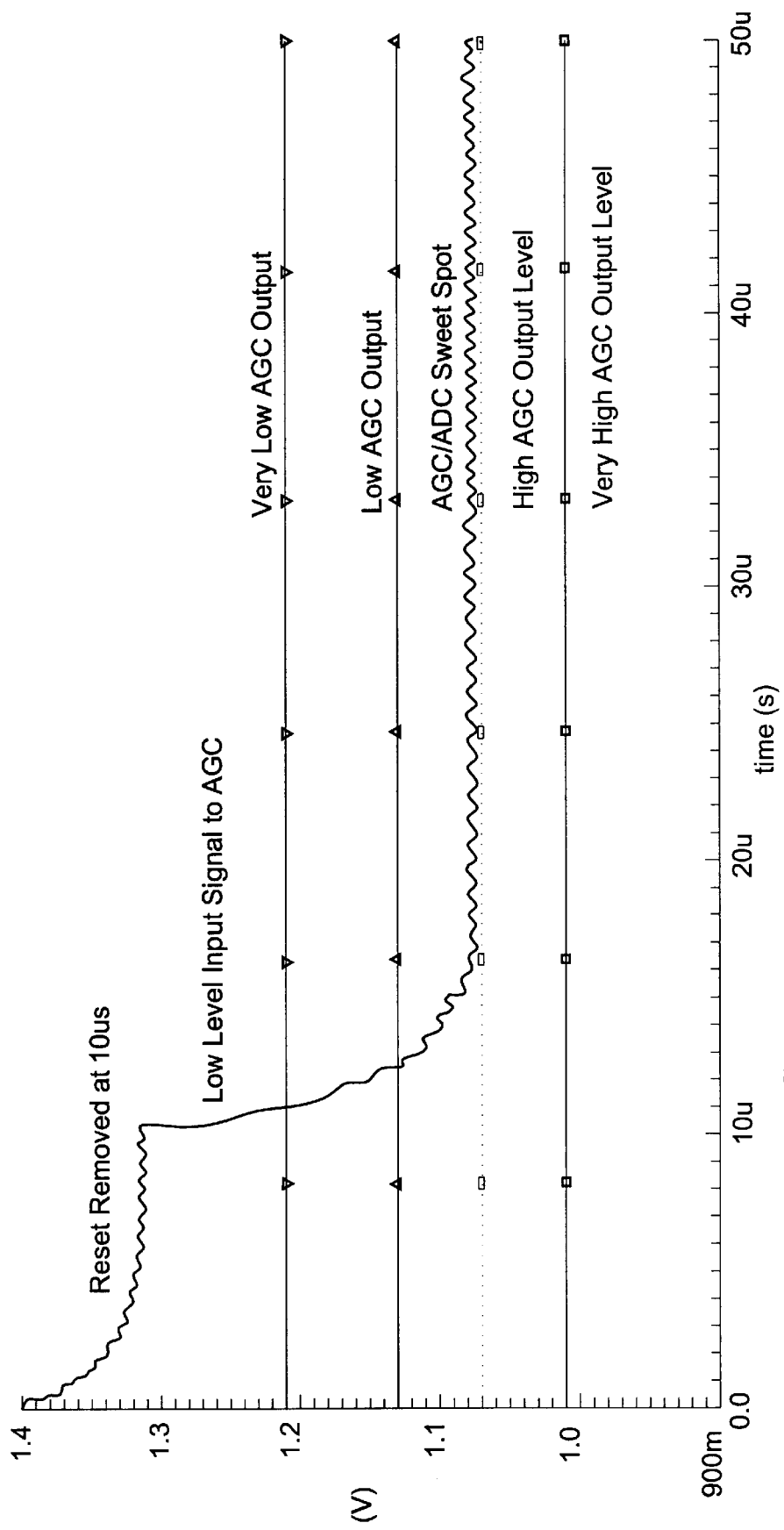
FIG. 7 is a plot of AGC operation showing RSSI response and gain ranges (fast response mode).
Figure 8:
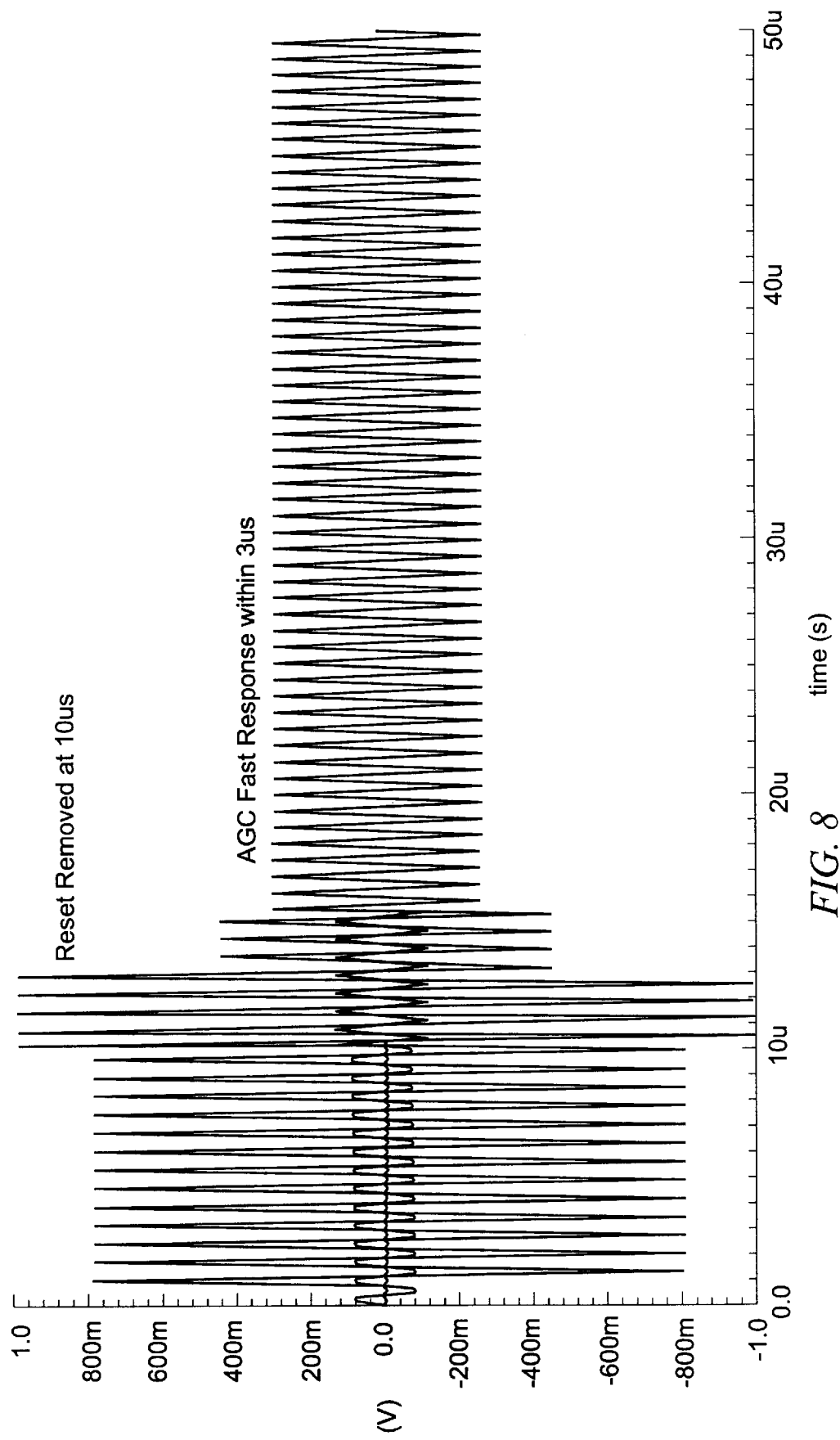
FIG. 8 is a plot illustrating response to a wide dynamic range of input signal levels (fast response mode).
Figure 9:
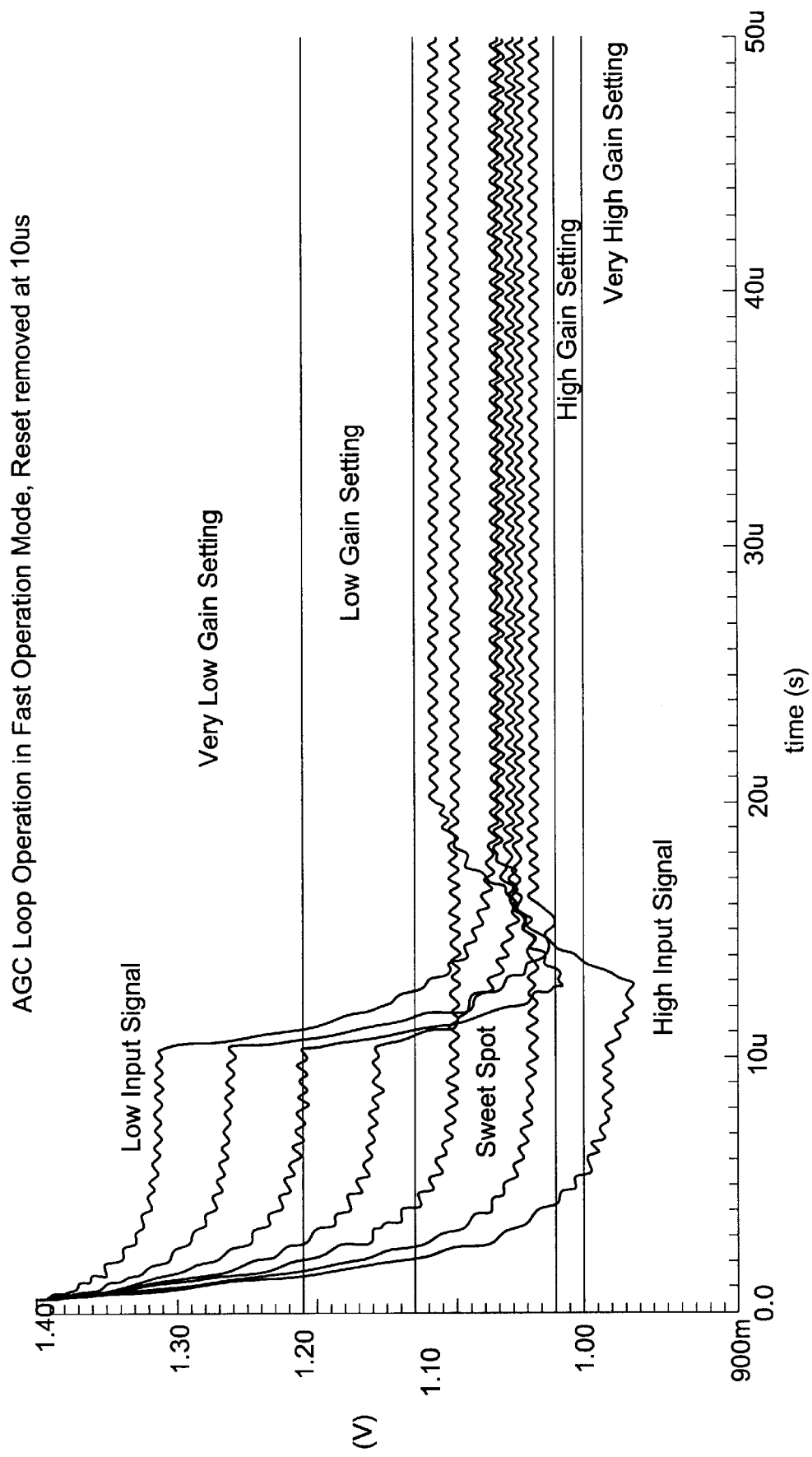
FIG. 9 is a plot illustrating RSSI response to a wide dynamic range of input signal levels (fast response mode).
Figure 10:
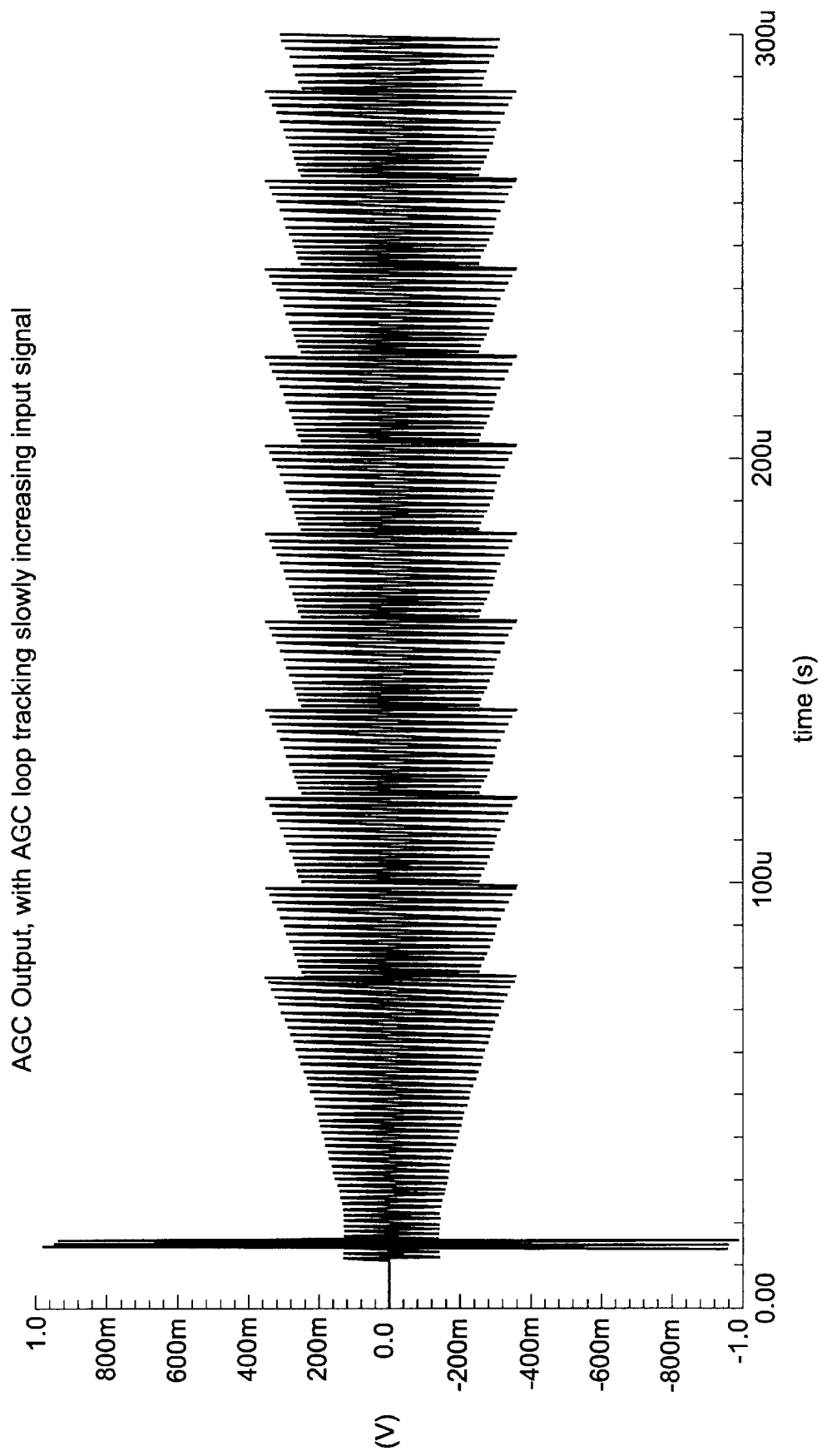
FIG. 10 is a plot illustrating AGC output response to a slowly changing input signal (tracking mode).
Figure 11:
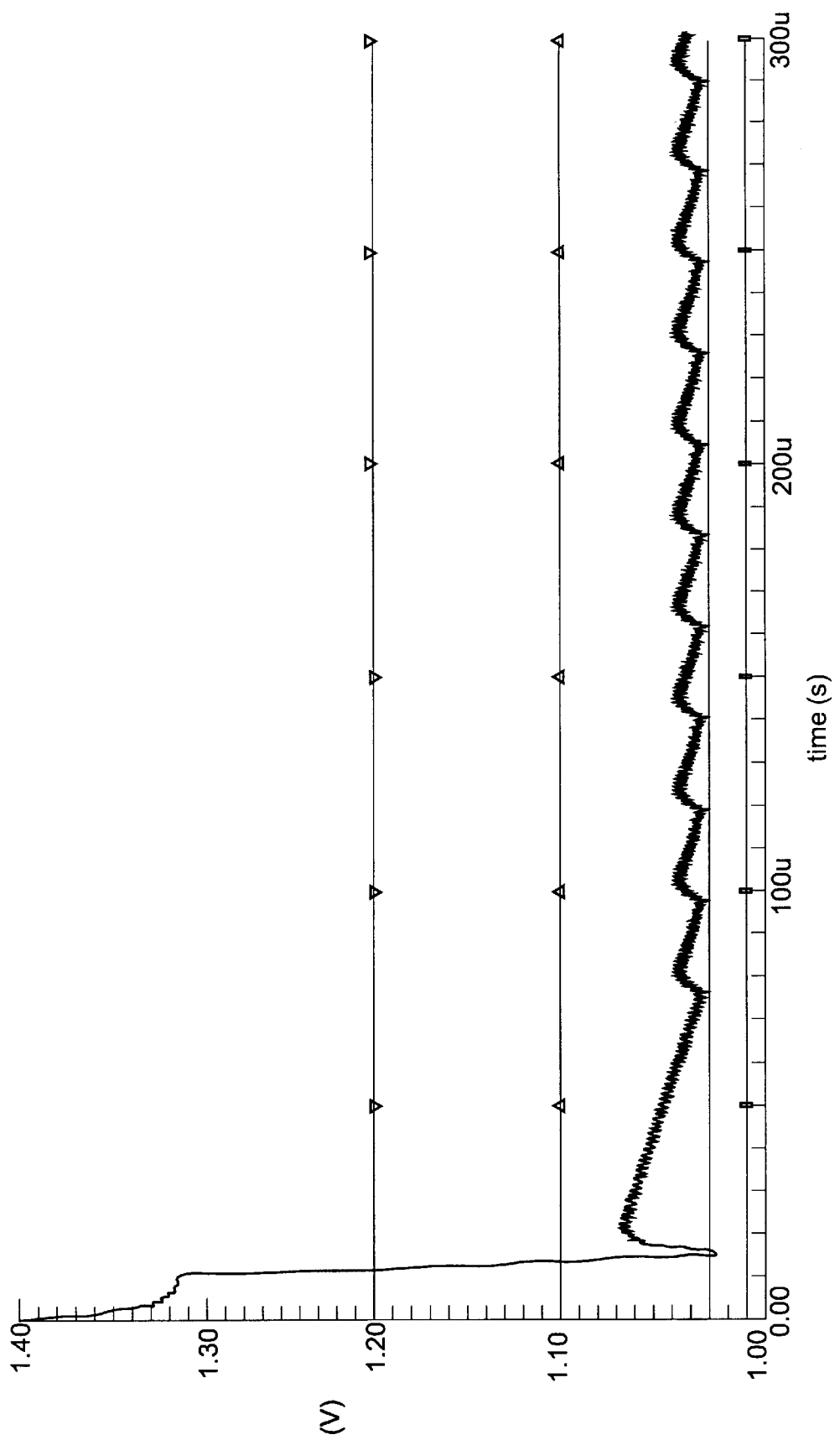
FIG. 11 is a plot illustrating AGC operation showing RSSI response and gain ranges (tracking mode).

FIGS. 6–11 are graphs illustrating response of the AGC circuitry in accordance with the invention. In FIG. 6, AGC output response to a low level input signal (fast attack or fast response mode); FIG. 7 illustrates AGC operation showing RSSI response and gain ranges in the fast attack mode of operation; FIG. 8 illustrates response to a wide dynamic range of input signal levels in the fast attack mode of operation; FIG. 9 illustrates RSSI response to a wide dynamic range of input signal levels in the fast attack mode of operation; FIG. 10 illustrates AGC output response to a slowly changing input signal in the tracking mode of operation; and FIG. 11 illustrates AGC operation with RSSI response and gain ranges in the tracking mode of operation.

The AGC architecture in accordance with the present invention offers improved flexibility and speed of operation with input signals having diverse power level ranges by combining the best features of analog and digital AGC circuitry. While the invention has been described with reference to specific embodiments, the description is illustrative of the invention and is not to be construed as limiting the invention. Various modifications and application may occur to those skilled in the art without departing from the true spirit and scope of the invention as defined by the appended claims.

What is claimed is:

1. An automatic gain control circuit comprising:
   a) a gain controlled amplifier for receiving an input signal of varying strength and producing an amplified analog output signal,
   b) a receive signal strength indicator (RSSI) circuit for receiving the amplified analog signal and producing an analog voltage indicative of strength of signal,
   c) an analog to digital converter for converting the analog voltage for the RSSI circuit to a digital signal, said converter comprising a plurality of comparators for comparing the output voltage from the RSSI circuit to threshold voltages and generating output signals indicative of the voltage comparisons, and
   d) decision logic circuitry responsive to the digital signals for controlling gain of the gain controlled amplifier.

2. The automatic gain control circuit as defined by claim 1 wherein the plurality of comparators provide indications of the RSSI output voltage being very low, low, high or very high as inputs to the decision logic circuit.

3. The automatic gain control circuit as defined by claim 2 wherein the decision logic circuitry provides a fast acquisition mode of operation and a tracking mode of operation depending on the output signals from the plurality of comparators.

4. The automatic gain control circuit as defined by claim 3 wherein the gain controlled amplifier comprises a plurality of cascaded gain control amplifier circuits, the gains of the cascaded gain control amplifier circuits being controlled by the decision logic circuitry.

5. The automatic gain control circuit is defined by claim 4 and further including an analog to digital converter (ADC) for receiving the amplified analog output signal from the gain controlled amplifier and producing a digital output signal.

6. The automatic gain control circuit as defined by claim 1 wherein the gain controlled amplifier comprises a plurality of cascaded gain controlled amplifier circuits, the gains of the cascaded gain control amplifier circuits being controlled by the decision logic circuitry.

7. The automatic gain control circuit as defined by claim 6 wherein the analog to digital converter comprises a plurality of comparators for comparing the output voltage from the RSSI circuit to threshold voltages and generating output signals indicative of the voltage comparisons.

8. The automatic gain control circuit as defined by claim 7 wherein the plurality of comparators provide indications of the RSSI output voltage being very low, low, high, or very high as inputs to the decision logic circuit.

9. The automatic gain control circuit as defined by claim 8 and further including an analog to digital converter (ADC) for receiving the amplified analog output signal from the gain controlled amplifier and producing a digital output signal.

10. In an automatic gain control circuit, a control loop for controlling gain comprising:
   a) a receive signal strength indicator (RSSI) circuit for receiving an amplified analog signal and producing an output voltage indicative of strength of the signal,
   b) a plurality of comparators for comparing the output voltage from the RSSI circuit to threshold voltages and generating output signals indicative of the voltage comparisons, and
   c) decision logic circuitry responsive to the output signals from the plurality of comparators for controlling gain of an amplifier.

11. The control loop as defined by claim 10 wherein the plurality of comparators provide indications of the RSSI output voltage being very low, low, high, or very high as inputs to the decision logic circuit.

12. The control loop as defined by claim 11 wherein the decision logic circuitry provides a fast acquisition mode of operation and a tracking mode of operation depending on the output signals from the plurality of comparators.

13. The control loop as defined by claim 12 wherein the threshold voltages to the plurality of comparators are programmable.

14. The control loop as defined by claim 10 wherein the threshold voltages to the plurality of comparators are programmable.

* * * * *